(12) United States Patent
Fukuoka (10) Patent No.: US 8,258,679 B2
(45) Date of Patent: Sep. 4, 2012

(54) PIEZOELECTRIC CERAMIC COMPRISING A BISMUTH LAYERED COMPOUND AND PIEZOELECTRIC ELEMENT

(75) Inventor: Shuuichi Fukuoka, Kirishima (JP)

(73) Assignee: Kyocera Corporation, Kyoto (JP)

( * ) Notice: Subject to any disclaimer, the term of this patent is extended or adjusted under 35 U.S.C. 154(b) by 561 days.

(21) Appl. No.: 12/521,113

(22) PCT Filed: Dec. 21, 2007

(86) PCT No.: PCT/JP2007/074724
§ 371 (c)(1),
(2), (4) Date: Sep. 10, 2009

(87) PCT Pub. No.: WO2008/078703
PCT Pub. Date: Jul. 3, 2008

(65) Prior Publication Data
US 2010/0096952 A1    Apr. 22, 2010

(30) Foreign Application Priority Data

Dec. 25, 2006  (JP) .................................. 2006-348410
Oct. 29, 2007  (JP) .................................. 2007-279861

(51) Int. Cl.
*H01L 41/187* (2006.01)
*C04B 35/00* (2006.01)

(52) U.S. Cl. ................... 310/358; 501/134; 252/62.9 R; 252/62.9 PZ (58) Field of Classification Search ............ 310/358; 252/62.9 R, 62.9 PZ; 501/134
See application file for complete search history.

(56) References Cited

U.S. PATENT DOCUMENTS 6,426,017 B2   7/2002   Takahashi et al. ....... 252/62.9 R
7,560,089 B2 *  7/2009   Takao et al. ................ 423/594.7
2001/0015420 A1 *  8/2001   Hirose et al. ............. 252/62.9 R
2001/0042852 A1   11/2001  Takahashi et al. ....... 252/62.9 R
2003/0100436 A1 *  5/2003   Takahashi ..................... 501/134
2010/0096952 A1 *  4/2010   Fukuoka ...................... 310/365
2011/0133608 A1 *  6/2011   Fukuoka ...................... 310/365

FOREIGN PATENT DOCUMENTS

| EP | 1035590 A2 * | 9/2000 |
| JP | 2001-316177 | 11/2001 |
| JP | 2002-167276 | 6/2002 |
| JP | 2002167276 A * | 6/2002 |
| JP | 2002-193664 | 7/2002 |
| JP | 2002193664 A * | 7/2002 |
| JP | 2003-034574 | 2/2003 |
| JP | 2004269322 A * | 9/2004 |
| JP | 2005001987 A * | 1/2005 |
| JP | 2008208004 A * | 9/2008 |
| JP | 2009084067 A * | 4/2009 |
| JP | 2009221066 A * | 10/2009 |
| JP | 2010047465 A * | 3/2010 |
| JP | 2011213538 A * | 10/2011 |

* cited by examiner

*Primary Examiner* — Jaydi San Martin
(74) *Attorney, Agent, or Firm* — DLA Piper LLP (US)

(57) ABSTRACT

The present invention provides a piezoelectric ceramic and a piezoelectric element, which have a large dynamic $d_{33}$ (dynamic piezoelectric coefficient $d_{33}$), can be used even under an elevated temperature of 200° C., and exhibit a small variation between the dynamic $d_{33}$ at room temperature and the dynamic $d_{33}$ at 200° C. The piezoelectric ceramic of the present invention is characterized by containing 100 parts by mass of a bismuth layered compound as a main component and a total of 0.05 to 1 part by mass, in terms of oxides ($MnO_2$ and $Fe_2O_3$), of at least one of Mn and Fe, the bismuth layered compound being represented by a compositional formula of $Bi_4Ti_3O_3O_{12} \cdot \beta[(1-\gamma)M1TiO_3 \cdot \gamma M2M3O_3]$, wherein $\beta$ and $\gamma$ satisfy the following formulae: $0.405 \leq \beta \leq 0.498$ and $0 \leq \gamma \leq 0.3$, M1 represents at least one selected from Sr, Ba, Ca, $(Bi_{0.5}Na_{0.5})$ $(Bi_{0.5}Li_{0.5})$ and $(Bi_{0.5}K_{0.5})$, M2 is at least one selected from Bi, Na, K and Li, and M3 is at least one of Fe and Nb.

4 Claims, 4 Drawing Sheets

PIEZOELECTRIC CERAMIC COMPRISING A BISMUTH LAYERED COMPOUND AND PIEZOELECTRIC ELEMENT

TECHNICAL FIELD

The present invention relates to a piezoelectric ceramic and a piezoelectric element, which are suitable for, for example, resonators, ultrasonic transducers, ultrasonic motors and piezoelectric sensors such as an acceleration sensor, a knock sensor, and an AE sensor, and are particularly suitably used as piezoelectric sensors utilizing a positive piezoelectric effect of thickness longitudinal vibration.

BACKGROUND ART

As products utilizing a piezoelectric ceramic, hitherto, there are piezoelectric sensors, filters, piezoelectric resonators, ultrasonic transducers, ultrasonic motors, and the like, for example. The piezoelectric sensors are used as a shock sensor, an acceleration sensor, or a knock sensor for automobile use, and particularly in recent years, the piezoelectric sensors are studied as a pressure sensor for directly detecting a pressure in a cylinder to optimize a timing of fuel injection from a fuel injector for the purpose of an improvement in fuel economy and reduction in exhaust gas (HC, NOx) of an automobile engine.

Conventionally, as a piezoelectric ceramic, a PZT (lead zirconate titanate)-based material or a PT (lead titanate)-based material, which has a high piezoelectric property, for example, a large piezoelectric coefficient d, has been used. However, it is pointed out that since the PZT-based material and the PT-based material respectively contain lead in an amount of about 60% by mass, these materials are at risk of eluting lead due to acid rain to invite environmental pollution. Thus, high expectations are placed on a lead-free piezoelectric material.

Further, since the PZT-based material or the PT-based material has a Curie temperature Tc of about 200° C. to about 300° C., the piezoelectric coefficient d is deteriorated in use under an elevated temperature of about 200° C. and the variation between the piezoelectric coefficient d at room temperature and the piezoelectric coefficient d at 200° C. is large, and therefore there are large constraints on its applications. For example, in the case of being used as a pressure sensor, if the piezoelectric coefficient d is deteriorated due to change with time, an output voltage varies even under the same pressure, and if the variation between the piezoelectric coefficient d at room temperature and the piezoelectric coefficient d at 200° C. is large, it becomes difficult to calculate an accurate pressure from the output voltage because the relationship between the pressure and the output voltage is not linear. Further, in order to obtain pressure sensor characteristics which are stable even under an elevated temperature of 200° C., a method using a single crystal such as langasite or quartz has also been investigated. However, when the single crystal is used, there is a problem that the piezoelectric coefficient d is small and chipping easily occurs and the single crystal is easily broken in processing the single crystal, and furthermore there is a problem that the production cost of the single crystal is extremely high.

Accordingly, a material which is predominantly composed of a bismuth layered compound is proposed as a piezoelectric ceramic not containing lead (for example, Patent Document 1). Many of the piezoelectric ceramics predominantly composed of a bismuth layered compound have a Curie temperature of about 400° C. or higher, and such a piezoelectric ceramic has high heat resistance and has the potential to be applied to a sensor which is used in an environment which is exposed to elevated temperatures, for example, in an engine room.

Patent Document 1: Japanese Unexamined Patent Publication No. 2002-167276

DISCLOSURE OF THE INVENTION

Problems to be Solved by the Invention

However, when the piezoelectric ceramic predominantly composed of a bismuth layered compound described in Patent Document 1 is used for applications in which the material is exposed to an elevated temperature of about 200° C., for example, an application as a piezoelectric element for a pressure sensor for directly detecting the pressure in a cylinder, although the piezoelectric ceramic has high heat resistance, there is a problem that its change rate of dynamic $d_{33}$ (dynamic piezoelectric coefficient $d_{33}$), which determines the detection sensitivity of the pressure, upon temperature change is large and therefore in a temperature range of from room temperature to 200° C., the resolution of pressure detection is deteriorated and the sensitivity becomes poor.

Herein, the dynamic $d_{33}$ refers to a $d_{33}$ derived from the formula described later using actual measurements of an output voltage at the time of directly applying a load to the piezoelectric element. Conventionally, the dynamic $d_{33}$ has been measured using a resonance impedance method, but in this method, since the load applied to the piezoelectric element is small, the dynamic characteristic at the time of applying an actual load cannot be evaluated. Therefore, the piezoelectric coefficient $d_{33}$ (output electrical charge/change in pressure) is measured from the relationship between pressure and output electrical charge at the time of applying an actual load and this piezoelectric coefficient $d_{33}$ is taken as a dynamic $d_{33}$.

As for a specific measuring method, first, an offset pressure of 200 N is applied to the piezoelectric element, and a pressure of 150 N is applied in a triangle waveform in addition to the offset pressure. The output electrical charge Q upon the peak pressure of the triangle wave of 150 N applied to the piezoelectric element is evaluated by a charge amplifier. The dynamic $d_{33}$ is determined from the relationship of the output electrical charge Q upon application of a pressure of 150 N to yield $d_{33}$=Q/150 N (change in load). That is, the dynamic $d_{33}$ has a unit of C (Coulomb)/N and means a piezoelectric $d_{33}$ in a dynamic condition at the time of applying a load to the piezoelectric element.

Here, the offset pressure of 200 N is applied in order to attain stable output characteristics by preventing a tensile force toward the piezoelectric element from being exerted on a direction of a pressure. Further, a change in load is set at 150 N in order to cover a pressure range required for detecting changes in pressure in a cylinder of an engine which is an application of the present invention.

Accordingly, it is an object of the present invention to provide a piezoelectric ceramic and a piezoelectric element, which have excellent heat resistance and a small variation between the dynamic $d_{33}$ at room temperature and the dynamic $d_{33}$ at 200° C.

Means for Solving the Problems

A piezoelectric ceramic of the present invention is characterized by containing 100 parts by mass of a bismuth layered compound as a main component and a total of 0.05 to 1 part by mass, in terms of oxides ($MnO_2$ and $Fe_2O_3$), of at least one of Mn and Fe, the bismuth layered compound being represented by a compositional formula of $Bi_4Ti_3O_{12} \cdot \beta[(1-\gamma)M1TiO_3 \cdot \gamma M2M3O_3]$, wherein $\beta$ and $\gamma$ satisfy the following formulae: $0.405 \leq \beta \leq 0.498$ and $0 \leq \gamma \leq 0.3$, M1 represents at least one selected from Sr, Ba, Ca, $(Bi_{0.5}Na_{0.5})$, $(Bi_{0.5}Li_{0.5})$ and $(Bi_{0.5}K_{0.5})$, M2 is at least one selected from Bi, Na, K and Li, and M3 is at least one of Fe and Nb.

Further, $\beta$ and $\gamma$ preferably satisfy the following formulae: $0.405 \leq \beta \leq 0.495$ and $0.1 \leq \gamma \leq 0.3$. $M2M3O_3$ preferably represents at least one selected from $BiFeO_3$, $NaNbO_3$, $KNbO_3$ and $LiNbO_3$. A piezoelectric element of the present invention is characterized by including the piezoelectric ceramic and electrodes formed on both sides of the piezoelectric ceramic, respectively.

Effects of the Invention

According to the piezoelectric ceramic of the present invention, by containing 100 parts by mass of a bismuth layered compound as a main component and a total of 0.05 to 1 part by mass, in terms of oxides ($MnO_2$ and $Fe_2O_3$), of at least one of Mn and Fe, the bismuth layered compound being represented by a compositional formula of $Bi_4Ti_3O_{12} \cdot \beta[(1-\gamma)M1TiO_3 \cdot \gamma M2M3O_3]$, wherein $\beta$ and $\gamma$ satisfy the following formulae: $0.405 \leq \beta \leq 0.498$ and $0 \leq \gamma \leq 5\ 0.3$, M1 represents at least one selected from Sr, Ba, Ca, $(Bi_{0.5}Na_{0.5})$, $(Bi_{0.5}Li_{0.5})$ and $(Bi_{0.5}K_{0.5})$, M2 is at least one selected from Bi, Na, K and Li, and M3 is at least one of Fe and Nb, a perovskite crystal structure in the bismuth layered compound is a morphotropic phase boundary (MPB) where a tetragonal phase and an orthorhombic phase coexist. Therefore, the variation between the dynamic $d_{33}$ at room temperature and the dynamic $d_{33}$ at 200° C. is within a range of plus or minus 5% and the piezoelectric ceramic of the present invention has excellent temperature stability.

Furthermore, according to the present invention, since a large dynamic $d_{33}$ is attained and the piezoelectric ceramic has a high Curie point, the piezoelectric ceramic can have characteristics in which even if the piezoelectric ceramic is left to stand under an elevated temperature of 200° C., the deterioration of the dynamic $d_{33}$ is small and the heat resistance is excellent.

When $\beta$ and $\gamma$ satisfy the following formulae: $0.405 \leq \beta \leq 0.495$ and $0.1 \leq \gamma \leq 0.3$, since the dynamic $d_{33}$ can be enhanced more, and since an optimum range of firing temperature is expanded, it is possible to reduce the variations in characteristics to achieve a high yield.

Since $M2M3O_3$ represents at least one selected from $BiFeO_3$, $NaNbO_3$, $KNbO_3$ and $LiNbO_3$, the dynamic $d_{33}$ can be further enhanced, and since an optimum range of firing temperature is expanded, it is possible to reduce the variations in characteristics to achieve a high yield.

Thereby, the piezoelectric ceramic of the present invention exhibits useful characteristics as a piezoelectric ceramic for a pressure sensor used in a high-temperature environment, and can be used for nonvolatile ferroelectric memory devices which can be used under elevated temperatures since the deterioration of piezoelectric properties is not recognized even in a pressure sensor for directly detecting a pressure in a cylinder of automobile engine, a shock sensor compatible with an SMD (Surface Mount Device), or an elevated temperature of 200° C.

Furthermore, since the piezoelectric element of the present invention includes the piezoelectric ceramic and electrodes formed on both sides of the piezoelectric ceramic, respectively, it has excellent temperature stability up to elevated temperatures and the deterioration of dynamic $d_{33}$ is small even if it is left to stand under an elevated temperature. Further, by forming a piezoelectric ceramic made of a polycrystal, chipping in processing or carrying the material is suppressed significantly in comparison with the single crystal. Furthermore, since the piezoelectric ceramic can be obtained by molding a material into a desired shape with a die or the like and firing the molded material, it is also possible to employ a process step in which a step of processing the shape is not performed after the step of firing. Eliminating processing of the shape after firing allows less chipping to occur and the process step to be simplified and cost reduction can be realized.

Furthermore, since the piezoelectric element is prepared by forming electrodes on both main faces of the piezoelectric ceramic, and is polarized in a direction of thickness and operated in a thickness longitudinal vibration mode, it has large anisotropy and therefore stable output characteristics, in which only a piezoelectric longitudinal effect is exerted, are easily attained.

BEST MODE FOR CARRYING OUT THE INVENTION

The piezoelectric ceramic of the present invention contains 100 parts by mass of a bismuth layered compound as a main component and a total of 0.05 to 1 part by mass, in terms of oxides ($MnO_2$ and $Fe_2O_3$), of at least one of Mn and Fe, the bismuth layered compound being represented by a compositional formula of $Bi_4Ti_3O_{12} \cdot \beta[(1-\gamma)M1TiO_3 \cdot \gamma M2M3O_3]$ in terms of the molar ratio, wherein $\beta$ and $\gamma$ satisfy the following formulae: $0.405 \leq \beta \leq 0.498$ and $0 \leq \gamma \leq 0.3$, M1 represents at least one selected from Sr, Ba, Ca, $(Bi_{0.5}Na_{0.5})$, $(Bi_{0.5}Li_{0.5})$ and $(Bi_{0.5}K_{0.5})$, M2 is at least one selected from Bi, Na, K and Li, and M3 is at least one of Fe and Nb.

Hereinafter, the reason why $\beta$, being a coefficient, is set within the above-mentioned range will be described. The reason for setting $\beta$ within a range of $0.405 \leq \beta \leq 0.498$ in the above-mentioned compositional formula is that if $\beta$ is larger than 0.498, the change rate of the dynamic $d_{33}$ upon temperature change at 200° C. becomes larger than +5%, and if $\beta$ is smaller than 0.405, the change rate of the dynamic $d_{33}$ upon temperature change at 200° C. becomes smaller than −5%.

Figure 1:
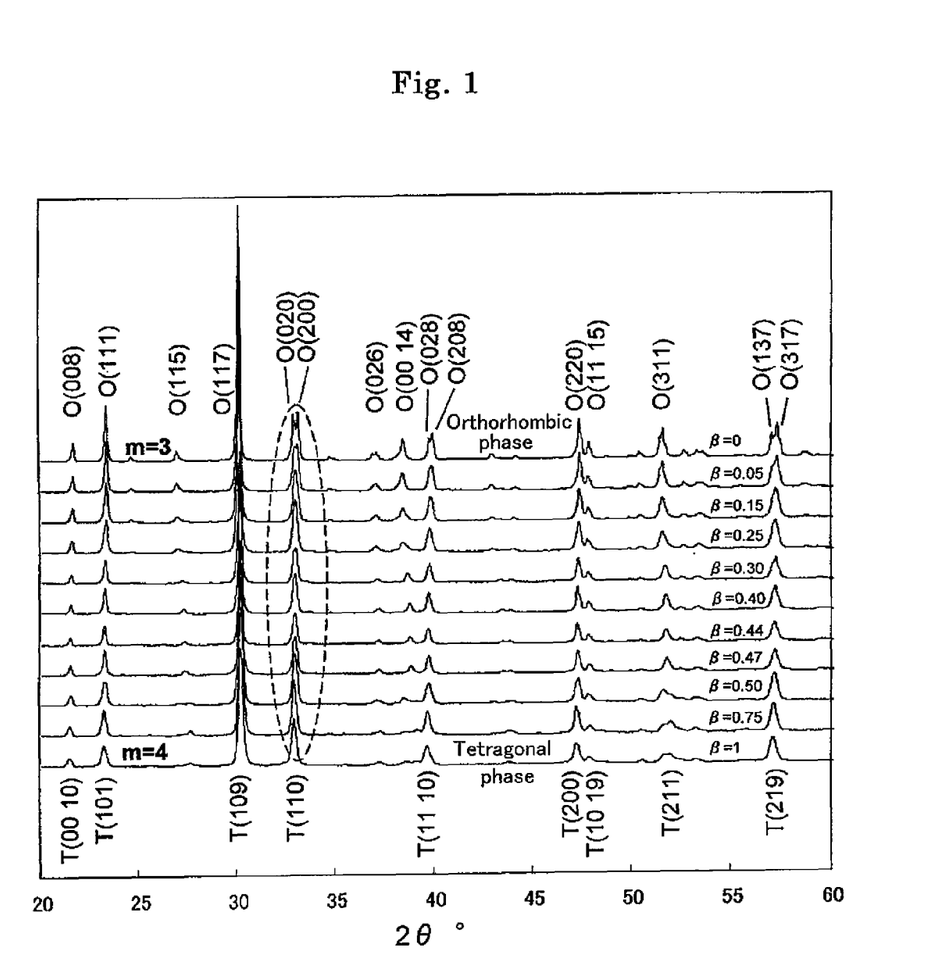
FIG. 1 is a chart of X-ray diffraction of a piezoelectric ceramic ($\beta$=0.44 and 0.47) of the present invention and another piezoelectric ceramic.

Thus, in a range of $\beta$ represented by the formula, $0.405 \leq \beta \leq 0.498$, the piezoelectric ceramic exhibits behaviors in which the dynamic $d_{33}$ takes the value which is adequately larger than 15 pC/N and the change rate of dynamic $d_{33}$ upon temperature change turns from plus to minus. FIG. 1 shows the results of changes in crystal structure when varying $\beta$, which is analyzed by X-ray diffraction. FIG.

Figure 2:
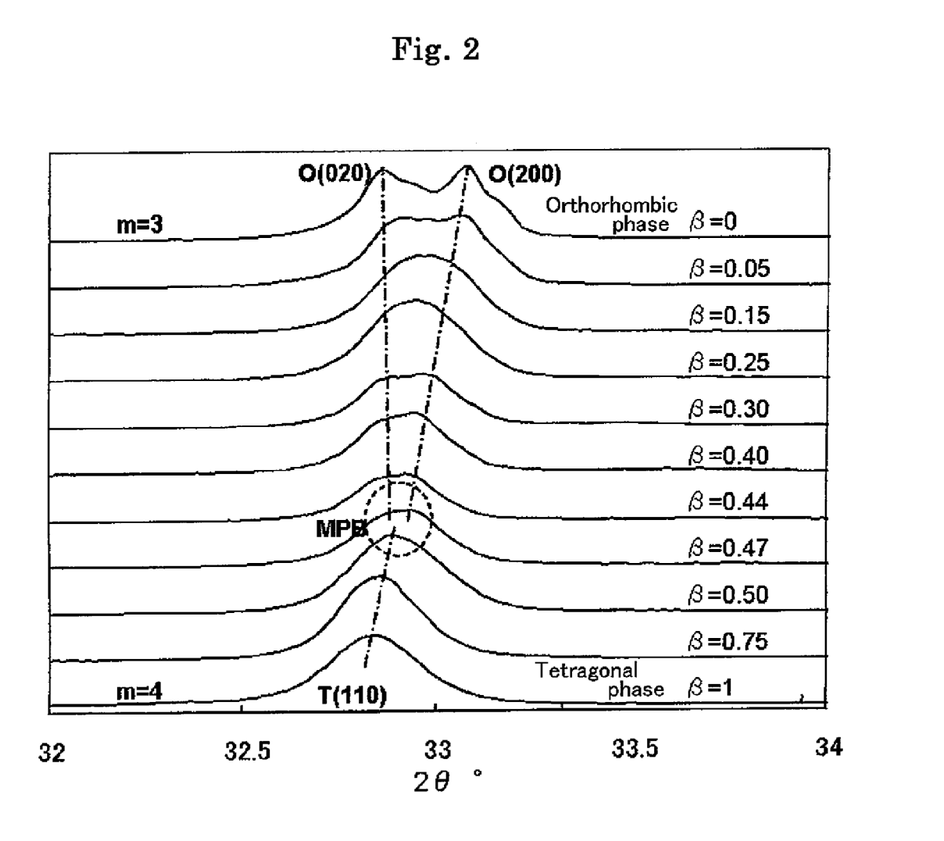
FIG. 2 is a chart of X-ray diffraction of a piezoelectric ceramic ($\beta$=0.44 and 0.47) of the present invention and another piezoelectric ceramic and an enlarged view of the X-ray diffraction chart of FIG. 1.

2 is an enlarged view of a part where 2θ is an angle of 32 to 34°. When β=0, the crystal is an orthorhombic crystal (the length of an a-axis is not equal to the length of a b-axis) and when β=1, the crystal is a tetragonal crystal (the length of an a-axis is equal to the length of a b-axis). In the range of β of from 0.405 to 0.495, the tetragonal crystal and the orthorhombic crystal coexist, and this range corresponds to a morphotropic phase boundary (MPB). The MPB is well known in the area of the PZT piezoelectric material and the MPB is formed in a compositional region where the piezoelectric material is composed of a rhombohedron crystal of PZ and a tetragonal crystal of PT in proportions of about 1:1. The piezoelectric coefficient d exhibits the maximum value and a temperature coefficient of the piezoelectric coefficient varies largely near the MPB of the PZT. As with this phenomenon, a range of β represented by $0.405 \leq \beta \leq 0.498$ on the composition corresponds to a morphotropic phase boundary MPB where a phenomenon specific to a piezoelectric body is shown since this range is a boundary between two kinds of crystal phases, and the change rate of dynamic $d_{33}$ upon temperature change decreases to near 0 and a large dynamic $d_{33}$ is achieved in this range.

A range of an amount of replacement with M2M3O$_3$ is set at $0.1 \leq \gamma \leq 0.3$ because if γ is less than 0.1, an optimum range of firing temperature is as narrow as about 10° C. or less. Further, γ was set at 0.3 or less because when γ is increased, the ability to be sintered is enhanced and an optimum range of firing temperature is expanded to about 25 to 30° C. without reducing the dynamic $d_{33}$ but if γ exceeds 0.3, the dynamic $d_{33}$ becomes small conversely.

Subsequently, the amount of Mn contained in addition to the main component will be described. The reason why the content of Mn is set within the range of 0.05 to 1 part by mass is that when the content of Mn is 0.05 part by mass or less in terms of $MnO_2$, since this material system becomes a plate-like crystal, the material is hardly sintered, a compact ceramic is hardly obtained and an elastic loss is increased, and therefore the dynamic $d_{33}$ becomes smaller than 15 pC/N, and that when the content of Mn is more than 1 part by mass, the ability to be sintered is improved but a hetero-phase is easily formed, and therefore the dynamic $d_{33}$ becomes 15 pC/N or less.

The amount of Fe contained in addition to the main component is similar to the case of Mn. The reason for the range of the content of Fe is that when the content of Fe is 0.05 part by mass or less in terms of $Fe_2O_3$, since this material system becomes a plate-like crystal, the material is hardly sintered, a compact ceramic is hardly obtained and an elastic loss is increased, and therefore the dynamic $d_{33}$ becomes smaller than 15 pC/N, and that when the content of Fe is more than 1 part by mass, the ability to be sintered is improved but a hetero-phase is easily formed, and therefore the dynamic $d_{33}$ becomes 15 pC/N or less.

Furthermore, the case where both Mn and Fe are contained is similar to the above, and it is preferable to contain a total of 0.05 to 1 part by mass, in terms of oxides ($MnO_2$ and $Fe_2O_3$), of Mn and Fe.

It is important that of M2M3O$_3$, M2 is at least one selected from Bi, Na, K and Li and M3 is at least one selected from Fe and Nb. Furthermore, it is desired that M2M3O$_3$ is at least one selected from $BiFeO_3$, $NaNbO_3$, $KNbO_3$ and $LiNbO_3$.

By selecting such compounds, it is possible to obtain a non-lead piezoelectric element composed of a bismuth layered structure, which has a large dynamic $d_{33}$ and high heat resistance and has a small change rate of dynamic $d_{33}$ upon temperature change at 200° C.

The piezoelectric ceramic of the present invention is one in which a compositional formula is represented by $Bi_4Ti_3O_{12} \cdot \beta M1TiO_3$ (when γ is zero) or $Bi_4Ti_3O_{12} \cdot \beta[(1-\gamma)M1TiO_3 \cdot \gamma M2M3O_3]$ and a main crystal phase is composed of the bismuth layered compound. That is, the piezoelectric ceramic of the present invention can achieve the bismuth layered structure having a morphotropic phase boundary (MPB) where a tetragonal crystal produced in the case of m=4 and an orthorhombic crystal produced in the case of m=3 coexist by adjusting the species and the amounts of constituent elements coordinated to an α site, a β site and an oxygen site in the general formula of a bismuth layered structure represented by $(Bi_2O_2)^{2+}(\alpha_{m-1}\beta_m O_{3m+1})^{2-}$. As a result of this, a characteristic piezoelectric property near the MPB composition, which is also known in the PZT, can also be realized in the bismuth layered compound.

Further, at least one of Mn and Fe may be intercrystallized in the main crystal phase and a part of this may be precipitated in a grain boundary as a crystal of a compound of at least one of Mn and Fe, and a pyrochlore phase, a perovskite phase, or a bismuth layered compound having a different structure may exist as another crystal phase, but there is no problem in characteristics as long as the amount of this crystal phase is trace.

Zr or the like from $ZrO_2$ balls used in pulverization may be mixed in the piezoelectric ceramic of the present invention, but there is no problem in characteristics as long as the amount of Zr or the like is trace.

In the piezoelectric ceramic of the present invention, as a raw material, for example, various oxides including $SrCO_3$, $BaCO_3$, $CaCO_3$, $Nb_2O_5$, $Bi_2O_3$, $MnO_2$, $TiO_2$, $Na_2CO_3$, $K_2CO_3$, $Li_2CO_3$ and $Fe_2O_3$, or a salt thereof can be used. The raw material is not limited to these compounds and a metal salt such as a carbonate or a nitrate, which produces an oxide through firing, may be used.

These raw materials were weighed out so as to contain 100 parts by mass of a main component and a total of 0.05 to 1 part by mass, in terms of oxides ($MnO_2$ and $Fe_2O_3$), of at least one of Mn and Fe, the main component being represented by a compositional formula of $Bi_4Ti_3O_{12} \cdot \beta[(1-\gamma)M1TiO_3 \cdot \gamma M2M3O_3]$, wherein β and γ satisfy the following formulae: $0.405 \leq \beta \leq 0.498$ and $0 \leq \gamma \leq 0.3$. Herein, M1 represents at least one selected from Sr, Ba, Ca, $(Bi_{0.5}Na_{0.5})$ $(Bi_{0.5}Li_{0.5})$ and $(Bi_{0.5}K_{0.5})$, M2 is at least one selected from Bi, Na, K and Li, and M3 is at least one of Fe and Nb. The powders weighed and mixed were pulverized so that the mean particle size distribution ($D_{50}$) falls within a range of 0.5 to 1 μm and this mixture was calcined at 800 to 1050° C., and to this mixture, a predetermined organic binder was added and the resulting mixture was wet-mixed and pelletized. The powder thus obtained was formed into a predetermined shape by publicly known press forming or the like and fired at a temperature of 1050 to 1250° C. for 2 to 5 hours in an oxidizing atmosphere such as the atmosphere to obtain a piezoelectric ceramic of the present inventions.

Figure 3:
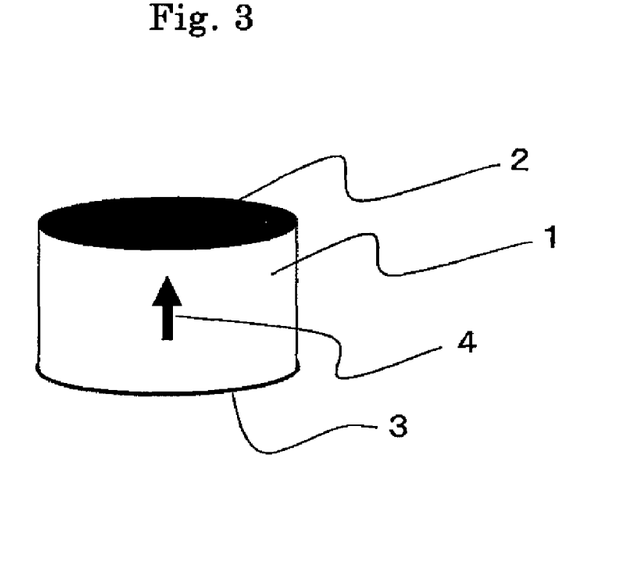
FIG. 3 is a drawing showing a pressure sensor which is the piezoelectric element of the present invention.

The piezoelectric ceramic of the present invention is most suitable for a piezoelectric ceramic for a pressure sensor as shown in FIG. 3, and it can also be used for piezoelectric resonators, ultrasonic transducers, ultrasonic motors and piezoelectric sensors such as an acceleration sensor, a knock sensor, and an AE sensor.

The piezoelectric element of the present invention is shown in FIG. 3. This piezoelectric element is constructed by forming electrodes 2, 3 on both sides of the above-mentioned piezoelectric ceramic 1. Further, the polarization of the piezoelectric ceramic is performed in a direction of thickness. That is, when a stress analysis by simulation is performed, since a maximum principal stress generated in the piezoelectric element is about a tenth of mechanical strength of the ceramic or less even under application of a high weight of 400 N which is under an actual operation, such a piezoelectric element is stable as a piezoelectric ceramic against changes in the applied pressure, and therefore a non-lead piezoelectric element which can be used under an elevated temperature of 200° C. can be attained.

EXAMPLES

First, as starting materials, an $SrCO_3$ powder, a $BaCO_3$ powder, a $CaCO_3$ powder, a $Bi_2O_3$ powder, a $TiO_2$ powder, an $Na_2CO_3$ powder, a $K_2CO_3$ powder, an $Li_2CO_3$ powder, an $Fe_2O_3$ powder, and an $Nb_2O_5$ powder, whose purities were 99.9%, were weighed out in such a way that when a compositional formula by the molar ratio of the bismuth layered compound is represented by $Bi_4Ti_3O_{12}\cdot\beta M1TiO_3$ (when $\gamma$ is zero) or $Bi_4Ti_3O_{12}\cdot\beta[(1-\gamma)M1TiO_3\cdot\gamma M2M3O_3]$, M1, M2, M3, $\beta$ and $\gamma$ are elements and blending ratios shown in Table 1.

The $MnO_2$ powder and the $Fe_2O_3$ powder were weighed out in such a way that amounts of these powders are represented by the parts by weight shown in Table 1 with respect to 100 parts by weight of this principal component, and mixed, and the resulting mixture was charged into a 500 ml plastic pot together with zirconia balls 99.9% in purity and isopropyl alcohol (IPA) and mixed for 16 hours with a rotary mill.

The resulting slurry after being mixed was dried in the air and passed through a 40 mesh screen, and thereafter, the screened dried slurry was held at 950° C. for 3 hours in the air to be calcined to obtain a synthetic powder. This synthetic powder was charged into a 500 ml plastic pot together with $ZrO_2$ balls 99.9% in purity and isopropyl alcohol (IPA) and pulverized for 20 hours to obtain a powder.

To the obtained powder, a proper amount of organic binder was added, and the resulting mixture was pelletized and the pellets were formed into a shape of a cylindrical molded material at a load of 150 MPa by press using a die, and then the pellets underwent a binder elimination step and were fired at a peak temperature at which the dynamic $d_{33}$ of each sample becomes the largest value between 1050° C. and 1250° C. for 3 hours in the air to obtain a disk-like piezoelectric ceramic in which dimensions of a piezoelectric element are 4 mm in diameter and 2 mm in thickness. Further, piezoelectric ceramics were prepared by varying the peak temperature of firing in steps of 5° C. within the range of ±20° C. relative to the above peak temperature at which the dynamic $d_{33}$ becomes the largest value to perform firing.

Thereafter, Ag electrodes were attached by firing to both surfaces of the cylindrical piezoelectric ceramic and a polarization treatment was performed by applying a DC voltage of 5 kV/mm or higher in a direction of thickness under a condition of 200° C. Thereafter, thermal aging was performed at 300° C. for 24 hours.

Figure 4:
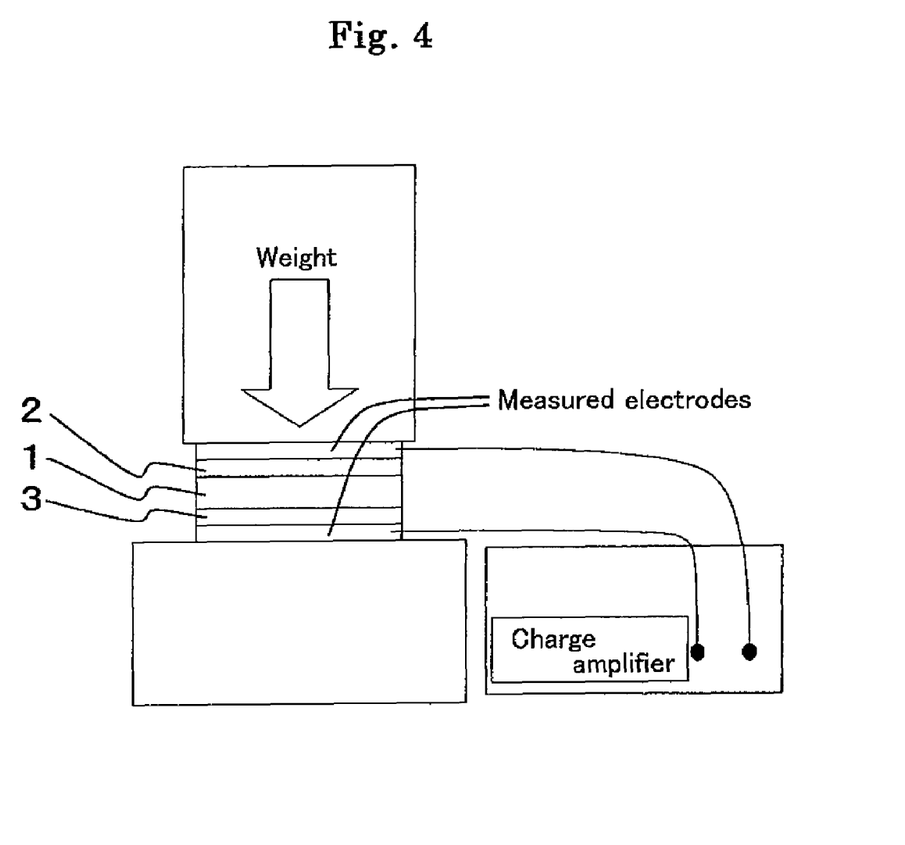
FIG. 4 is an illustrative view illustrating an apparatus for evaluating the dynamic $d_{33}$ used in the present invention.

Then, using an apparatus shown in FIG. 4, the dynamic $d_{33}$ was evaluated. Specifically, first, an offset pressure of 200 N was applied to the piezoelectric element. Thereafter, the pressure applied to the piezoelectric element was increased from 200 N to 350 N and then decreased to 200 N, and this procedure was repeated and changes in electrical charge quantity outputted from the piezoelectric element were measured by a charge amplifier. The change of pressure at this time was given by a triangle wave with a frequency of 10 Hz. The dynamic $d_{33}$ was determined from the following formula: Dynamic $d_{33}$=output electrical charge/change in pressure (unit pC/N). Similarly, the change rates of dynamic $d_{33}$ upon temperature change at −40° C. and at 200° C. were determined. The change rates of dynamic $d_{33}$ upon temperature change, for example, the change rates upon temperature change up to 200° C. was determined from the formula: change rate of dynamic $d_{33}$ upon temperature change=(dynamic $d_{33}$ (200° C.)−dynamic $d_{33}$)/dynamic $d_{33}$, using the dynamic $d_{33}$ at room temperature (25° C.) and the dynamic $d_{33}$ (200° C.) at 200° C.

Further, it is desired that the insulation resistance of the piezoelectric element is $1\times10^9\Omega$ or more for maintaining the detection sensitivity up to an elevated temperature of 200° C. If the insulation resistance is higher than this level, since consumption of outputted electrical charge in the piezoelectric element is inhibited and the electrical charge is supplied to a signal processing circuit, variations in sensitivity is small and the performance deterioration of sensor characteristics due to the reduction in sensitivity or noise sources do not occur.

Figure 5:
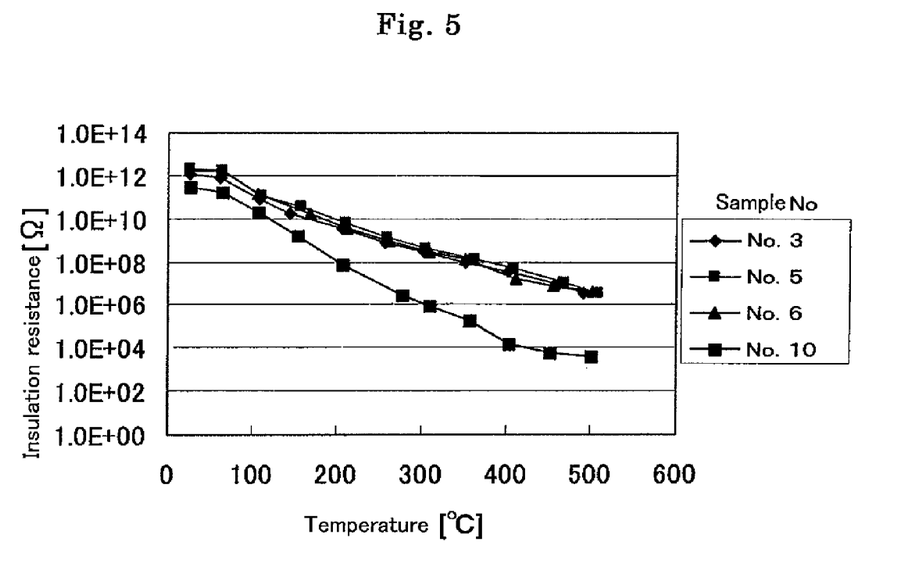
FIG. 5 is a graph showing the relationship between an insulation resistivity of the piezoelectric ceramic of the present invention and temperature.

A graph of a relationship between the insulation resistance and the temperature of the samples No. 3, 5, 6 and 10 is shown in FIG. 5. The insulation resistance at 200° C. of the samples No. 3, 5 and 6 was $1\times10^9\Omega$ or more. On the other hand, the insulation resistance of the sample No. 10 out of the scope of the present invention was $1\times10^9\Omega$ or more at relatively low temperatures, but it became lower than $1\times10^9\Omega$ at 150° C. or higher.

With respect to the compositions, the results of the sample having the largest dynamic $d_{33}$ are shown in Tables 1 and 2.

TABLE 1

| | | Composition | | | | | | | Temperature change rate of dynamic d33 | | |
|---|---|---|---|---|---|---|---|---|---|---|---|
| Sample No | M1 | β | M2 | M3 | γ | Additive amount of $MnO_2$ Parts by mass | Additive amount of $Fe_2O_3$ Parts by mass | Dynamic d33 pC/N | 25→ −40° C. % | 25→ 200° C. % | Insulation resistance |
| * 1 | $Sr_{0.5}Ba_{0.5}$ | 1.000 | Bi | Fe | 0.10 | 0.50 | — | 15.1 | −9.6 | 18.3 | ○ |
| * 2 | $Sr_{0.5}Ba_{0.5}$ | 0.750 | Bi | Fe | 0.10 | 0.50 | — | 17.5 | −10.5 | 16.9 | ○ |
| * 3 | $Sr_{0.5}Ba_{0.5}$ | 0.500 | Bi | Fe | 0.10 | 0.50 | — | 19.0 | −3.2 | 6.0 | ○ |
| 4 | $Sr_{0.5}Ba_{0.5}$ | 0.495 | Bi | Fe | 0.10 | 0.50 | — | 20.5 | −2.6 | 4.8 | ○ |
| 5 | $Sr_{0.5}Ba_{0.5}$ | 0.470 | Bi | Fe | 0.10 | 0.50 | — | 20.8 | −0.3 | 0.4 | ○ |
| 6 | $Sr_{0.5}Ba_{0.5}$ | 0.440 | Bi | Fe | 0.10 | 0.50 | — | 21.0 | 1.4 | −2.6 | ○ |
| 7 | $Sr_{0.5}Ba_{0.5}$ | 0.405 | Bi | Fe | 0.10 | 0.50 | — | 20.5 | 3.2 | −4.6 | ○ |
| * 8 | $Sr_{0.5}Ba_{0.5}$ | 0.400 | Bi | Fe | 0.10 | 0.50 | — | 20.0 | 2.9 | −5.5 | ○ |
| * 9 | $Sr_{0.5}Ba_{0.5}$ | 0.250 | Bi | Fe | 0.10 | 0.50 | — | 14.1 | −0.8 | 1.6 | ○ |

TABLE 1-continued

| Sample No | Composition M1 | β | M2 | M3 | γ | Additive amount of $MnO_2$ Parts by mass | Additive amount of $Fe_2O_3$ Parts by mass | Dynamic $d_{33}$ pC/N | Temperature change rate of dynamic $d_{33}$ 25→ -40° C. % | Temperature change rate of dynamic $d_{33}$ 25→ 200° C. % | Insulation resistance |
|---|---|---|---|---|---|---|---|---|---|---|---|
| * 10 | $Sr_{0.5}Ba_{0.5}$ | 0.150 | Bi | Fe | 0.10 | 0.50 | — | 12.0 | −0.6 | 1.2 | X |
| * 11 | $Sr_{0.5}Ba_{0.5}$ | 0.050 | Bi | Fe | 0.10 | 0.50 | — | 11.0 | −2.8 | 4.6 | X |
| * 12 | $Sr_{0.5}Ba_{0.5}$ | 0.000 | Bi | Fe | 0.10 | 0.50 | — | 8.0 | −3.9 | 6.5 | X |
| 13 | $Sr_{0.45}Ba_{0.45}Ca_{0.1}$ | 0.470 | Bi | Fe | 0.10 | 0.50 | — | 22.0 | 0.1 | −0.1 | ○ |
| 14 | $Sr_{0.5}(Bi_{0.5}Na_{0.5})_{0.5}$ | 0.470 | Bi | Fe | 0.10 | 0.50 | — | 19.0 | −2.0 | 3.7 | ○ |
| 15 | $Sr_{0.5}(Bi_{0.5}Li_{0.5})_{0.5}$ | 0.470 | Bi | Fe | 0.10 | 0.50 | — | 18.0 | −1.8 | 3.1 | ○ |
| 16 | $Sr_{0.5}(Bi_{0.5}K_{0.5})_{0.5}$ | 0.470 | Bi | Fe | 0,10 | 0.50 | — | 18.5 | −2.3 | 4.5 | ○ |
| 17 | $Ba_{0.5}Ca_{0.5}$ | 0.470 | Bi | Fe | 0.10 | 0.50 | — | 19.4 | −0.1 | 0.2 | ○ |
| 18 | $Sr_{0.5}Ba_{0.5}$ | 0.470 | Bi | Fe | 0.10 | 0.05 | — | 15.2 | −1.3 | 2.4 | ○ |
| 19 | $Sr_{0.5}Ba_{0.5}$ | 0.470 | Bi | Fe | 0.10 | 1.00 | — | 17.3 | −1.0 | 1.8 | ○ |
| * 20 | $Sr_{0.5}Ba_{0.5}$ | 0.470 | Bi | Fe | 0.10 | — | — | 16.4 | −3.3 | 6.5 | ○ |
| 21 | $Sr_{0.5}Ba_{0.5}$ | 0.470 | Na | Nb | 0.10 | 0.50 | — | 18.3 | −2.2 | 4.3 | ○ |
| 22 | $Sr_{0.5}Ba_{0.5}$ | 0.470 | K | Nb | 0.10 | 0.50 | — | 19.5 | −1.3 | 2.4 | ○ |
| 23 | $Sr_{0.5}Ba_{0.5}$ | 0.470 | Li | Nb | 0.10 | 0.50 | — | 18.8 | −1.8 | 3.3 | ○ |
| 24 | $Sr_{0.5}Ba_{0.5}$ | 0.470 | Bi | Fe | 0.30 | 0.50 | — | 17.4 | −1.5 | 2.5 | ○ |
| * 25 | $Sr_{0.5}Ba_{0.5}$ | 0.470 | Bi | Fe | 0.32 | 0.50 | — | 15.6 | −3.6 | 6.7 | ○ |
| * 26 | $Sr_{0.5}Ba_{0.5}$ | 0.500 | — | — | — | 0.50 | — | 17.4 | −3.3 | 6.0 | ○ |
| 27 | $Sr_{0.5}Ba_{0.5}$ | 0.498 | — | — | — | 0.50 | — | 18.1 | −0.2 | 0.3 | ○ |
| 28 | $Sr_{0.5}Ba_{0.5}$ | 0.470 | — | — | — | 0.50 | — | 19.4 | −0.1 | 0.2 | ○ |
| 29 | $Sr_{0.5}Ba_{0.5}$ | 0.440 | — | — | — | 0.50 | — | 19.5 | −0.1 | 0.2 | ○ |
| 30 | $Sr_{0.5}Ba_{0.5}$ | 0.405 | — | — | — | 0.50 | — | 19.2 | 0.2 | −0.3 | ○ |
| * 31 | $Sr_{0.5}Ba_{0.5}$ | 0.400 | — | — | — | 0.50 | — | 18.6 | 3.3 | −6.4 | ○ |

The samples marked "*" are out of the scope of the present invention.

TABLE 2

| Sample No | Composition M1 | β | M2 | M3 | γ | Additive amount of $MnO_2$ Parts by mass | Additive amount of $Fe_2O_3$ Parts by mass | Dynamic $d_{33}$ pC/N | Temperature change rate of dynamic $d_{33}$ 25→ -40° C. % | Temperature change rate of dynamic $d_{33}$ 25→ 200° C. % | Insulation resistance |
|---|---|---|---|---|---|---|---|---|---|---|---|
| * 32 | $Sr_{0.5}Ba_{0.5}$ | 0.470 | Bi | Fe | 0.10 | 1.50 | — | 10.3 | −1.2 | 1.6 | X |
| 33 | Sr | 0.470 | Bi | Fe | 0.10 | 0.50 | — | 20.4 | −4.3 | 4.8 | ○ |
| 34 | Ba | 0.470 | Bi | Fe | 0.10 | 0.50 | — | 15.2 | −1.1 | 3.5 | ○ |
| 35 | Ca | 0.470 | Bi | Fe | 0.10 | 0.50 | — | 15.4 | −2.3 | 1.8 | ○ |
| 36 | $Sr_{0.5}Ba_{0.5}$ | 0.470 | Bi | Fe | 0.10 | — | 0.05 | 17.1 | −1.4 | 4.7 | ○ |
| 37 | $Sr_{0.5}Ba_{0.5}$ | 0.470 | Bi | Fe | 0.10 | — | 0.50 | 16.5 | −1.7 | 3.3 | ○ |
| 38 | $Sr_{0.5}Ba_{0.5}$ | 0.470 | Bi | Fe | 0.10 | — | 1.00 | 15.3 | −2.9 | 2.5 | ○ |
| * 39 | $Sr_{0.5}Ba_{0.5}$ | 0.470 | Bi | Fe | 0.10 | — | 1.50 | 8.5 | −3.0 | 2.2 | X |
| 40 | $Sr_{0.5}Ba_{0.5}$ | 0.470 | Bi | Fe | 0.05 | 0.50 | — | 20.1 | −0.2 | 0.3 | ○ |
| * 41 | $Sr_{0.5}Ba_{0.5}$ | 0.470 | — | — | — | — | — | Unmeasurable because of breaking | | | |
| 42 | $Sr_{0.5}Ba_{0.5}$ | 0.470 | — | — | — | 0.05 | — | 17.5 | −0.3 | 1.2 | ○ |
| 43 | $Sr_{0.5}Ba_{0.5}$ | 0.470 | — | — | — | 1.00 | — | 20.8 | −0.2 | 1.4 | ○ |
| * 44 | $Sr_{0.5}Ba_{0.5}$ | 0.470 | — | — | — | 1.50 | — | 11.2 | −0.2 | 1.1 | X |
| 45 | $Sr_{0.5}Ba_{0.5}$ | 0.470 | — | — | — | — | 0.05 | 16.8 | −2.6 | 4.9 | ○ |
| 46 | $Sr_{0.5}Ba_{0.5}$ | 0.470 | — | — | — | — | 0.50 | 18.2 | −2.3 | 4.4 | ○ |
| 47 | $Sr_{0.5}Ba_{0.5}$ | 0.470 | — | — | — | — | 1.00 | 15.5 | −3.1 | 4.0 | ○ |
| * 48 | $Sr_{0.5}Ba_{0.5}$ | 0.470 | — | — | — | — | 1.50 | 7.4 | −3.0 | 3.6 | X |
| 49 | $Sr_{0.5}Ba_{0.5}$ | 0.470 | — | — | — | 0.25 | 0.25 | 18.7 | −1.9 | 2.8 | ○ |
| 50 | Sr | 0.470 | — | — | — | 0.50 | — | 16.8 | −3.9 | 4.9 | ○ |
| 51 | Ba | 0.470 | — | — | — | 0.50 | — | 15.2 | −1.6 | 3.5 | ○ |
| 52 | Ca | 0.470 | — | — | — | 0.50 | — | 15.3 | −1.9 | 2.4 | ○ |
| 53 | $Sr_{0.8}(Bi_{0.5}Na_{0.5})_{0.2}$ | 0.470 | — | — | — | 0.50 | — | 16.1 | −3.7 | 4.1 | ○ |
| 54 | $Sr_{0.8}(Bi_{0.5}Li_{0.5})_{0.2}$ | 0.470 | — | — | — | 0.50 | — | 15.5 | −1.5 | 2.8 | ○ |
| 55 | $Sr_{0.8}(Br_{0.5}K_{0.5})_{0.2}$ | 0.470 | — | — | — | 0.50 | — | 15.2 | −1.9 | 2.2 | ○ |

The samples marked "*" are out of the scope of the present invention.

As is apparent from Table 1, in the samples No. 27 to No. 30 within the scope of the present invention, values of the dynamic $d_{33}$ obtained were as high as 18.1 pC/N and the change rate between the dynamic $d_{33}$ at 25° C. and the dynamic $d_{33}$ at −40° C., and the change rate between the dynamic $d_{33}$ at 25° C. and the dynamic $d_{33}$ at 200° C. were within 0.4%, and hence the dynamic $d_{33}$ had low temperature-dependency.

On the other hand, in the sample No. 26 out of the scope of the present invention, since β is as large as 0.5, the dynamic $d_{33}$ was smaller than 18 pC/N, and the change rate between the dynamic $d_{33}$ at 25° C. and the dynamic $d_{33}$ at 200° C. was out of ±5% and hence the dynamic $d_{33}$ had high temperature-dependency. Further, in the sample No. 31 out of the scope of the present invention, since β was as small as 0.4, the change rate between the dynamic $d_{33}$ at 25° C. and the dynamic $d_{33}$ at 200° C. was larger than ±5%, and hence the dynamic $d_{33}$ had high temperature-dependency.

In the samples from No. 4 to No. 7, from No. 13 to No. 19 and from No. 21 to No. 24 within the scope of the present invention, values of the dynamic $d_{33}$ obtained were as high as 15 pC/N and the change rate between the dynamic $d_{33}$ at 25° C. and the dynamic $d_{33}$ at −40° C., and the change rate between the dynamic $d_{33}$ at 25° C. and the dynamic $d_{33}$ at 200° C. were within 4.8%, and hence the dynamic $d_{33}$ had low temperature-dependency.

On the other hand, in the samples No. 1 to No. 3 out of the scope of the present invention, since β was larger than 0.5, the change rates between the dynamic $d_{33}$ at 25° C. and the dynamic $d_{33}$ at 200° C. were larger than ±5%, and hence the dynamic $d_{33}$ had high temperature-dependency, and values of the dynamic $d_{33}$ lowered as values of β increased. Further, in the sample No. 8 out of the scope of the present invention, since β was as small as 0.4, the change rate between the dynamic $d_{33}$ at 25° C. and the dynamic $d_{33}$ at 200° C. was larger than ±5%, and hence the dynamic $d_{33}$ had high temperature-dependency. Furthermore, in the samples No. 9 to No. 12 out of the scope of the present invention, since β was smaller than 0.25, the dynamic $d_{33}$ was smaller than 15 pC/N. In the sample No. 20 out of the scope of the present invention, the change rate between the dynamic $d_{33}$ at 25° C. and the dynamic $d_{33}$ at 200° C. were larger than ±5%, and hence the dynamic $d_{33}$ had high temperature-dependency. In the sample No. 25 out of the scope of the present invention, since γ was as large as 0.32, the change rate between the dynamic $d_{33}$ at 25° C. and the dynamic $d_{33}$ at 200° C. was larger than ±5% and hence the dynamic $d_{33}$ had high temperature-dependency.

As is apparent from Table 2, in the samples from No. 33 to No. 38, No. 40, No. 42, No. 43, from No. 45 to No. 47 and from No. 49 to No. 55 within the scope of the present invention, values of the dynamic $d_{33}$ obtained were as high as 15.1 pC/N or more, and the change rate between the dynamic $d_{33}$ at 25° C. and the dynamic $d_{33}$ at −40° C. and the change rate between the dynamic $d_{33}$ at 25° C. and the dynamic $d_{33}$ at 200° C. were within 5%, and the dynamic $d_{33}$ had low temperature-dependency.

On the other hand, in the samples No. 32, No. 39, No. 44 and No. 48 out of the scope of the present invention, since the amount of $MnO_2$ or $Fe_2O_3$ was large, the dynamic $d_{33}$ was smaller than 15 pC/N and the insulation resistance was low. Further, in the sample No. 41 out of the scope of the present invention, since no $MnO_2$, $Fe_2O_3$ and $M2M3O_3$ to be a sintering aid were included, sintering of the sample was insufficient and the sample not to be broken under a pressurized condition in measuring the dynamic $d_{33}$ could not be prepared.

Furthermore, the dynamic $d_{33}$ of the sample, the firing temperature of which was changed, was compared with that of the sample having the largest dynamic $d_{33}$ and the temperature range of firing, in which the reduction in the dynamic $d_{33}$ was 20% or less, was investigated and this range was referred to as a stable firing temperature range of each composition. When this range is wide, a piezoelectric ceramic, in which variations in dynamic $d_{33}$ are small even if the firing temperature varies at the time of production and which has stable piezoelectric characteristics, can be manufactured.

In the samples from No. 27 to No. 30, No. 40, No. 42, No. 43, from No. 45 to No. 47 and from No. 49 to No. 55, in which γ≦0.05, stable firing temperature ranges were within a range of −5 to +5° C., that is, ±5° C. On the other hand, in the samples from No. 4 to No. 7, from No. 13 to No. 19, from No. 21 to No. 24 and from No. 33 to No. 38, in which 0.1≦γ≦0.3, stable firing temperature ranges were larger than ±10° C., and particularly in the samples from No. 4 to No. 7, from No. 13 to No. 19, No. 24 and from No. 33 to No. 38, in which $M2M3O_3$ is $BiFeO_3$, the temperature ranges were larger than ±15° C.

In addition, in FIG. 1 and FIG. 2, the X-ray diffraction charts of the samples No. 5 (β=0.47) and No. 6 (β=0.44) are shown. It can be found from the X-ray diffraction charts that the bismuth layered compound is a main crystal phase. The sample No. 5 is represented by a combination, a compositional formula of which is $Bi_4Ti_3O_{12} \cdot 0.47[0.9(Sr_{0.5}Ba_{0.5})TiO_3 \cdot 0.1BiFeO_3]$, of the bismuth layered compound and the perovskite compound. On the other hand, the bismuth layered compound is represented by the general formula, $(Bi_2O_2)^{2+}(\alpha_{m-1}\beta_mO_{3m+1})^{2-}$, and $Bi_4Ti_3O_{12}$ is a bismuth layered compound in the case where m is 3, in which an element of a is $Bi^{3+}$ and an element of β is $Ti^{4+}$ in the above-mentioned general formula and holds the condition of being electrically neutral.

It is thought from the X-ray diffraction charts that since the bismuth layered compound is recognized as the main crystal phase, the perovskite compound of $M2M3O_3$ is introduced into a pseudo-perovskite layer of the bismuth layered compound to become a part of the bismuth layered compound.

That is, the bismuth layered compound of the sample No. 4 is thought to have a crystal structure in the case where m is 4, in which the a site is composed of any one of Bi, Sr, and Ba elements, the β site is composed of any one of Ti and Fe elements, and the a site, the β site and an oxygen site involve defects, and specifically, the bismuth layered compound of the sample No. 4 is thought to be a bismuth layered compound in which Mn is partially intercrystallized in $(Sr_{0.5}Ba_{0.5})_{0.4455}Bi_4Ti_{3.4455}Fe_{0.0495}O_{13.485}$.

Thus, by considering the bismuth layered compound in the case where m is 4 to be a composite of the bismuth layered compound in the case where m is 3 and a perovskite compound, and partially replacing the perovskite compound in the case where m is 4 with another perovskite compound, a non-lead piezoelectric material, which exhibits a characteristic property also in terms of ceramic strength in addition to electric characteristics, can be obtained.

The invention claimed is:

1. A piezoelectric ceramic comprising 100 parts by mass of a bismuth layered compound as a main component and a total of 0.05 to 1 part by mass, in terms of $MnO_2$ and $Fe_2O_3$, of at least one of Mn and Fe, the bismuth layered compound being represented by a compositional formula of $Bi_4Ti_3O_{12} \cdot \beta[(1-\gamma)M1TiO_3 \cdot \gamma M2M3O_3]$, wherein β and γ satisfy the following formulae: 0.405≦β≦0.498 and 0≦γ≦0.3, M1 represents at least one selected from Sr, Ba, Ca, $(Bi_{0.5}Na_{0.5})$, $(Bi_{0.5}Li_{0.5})$ and $(Bi_{0.5}K_{0.5})$, M2 is at least one selected from Bi, Na, K and Li, and M3 is at least one of Fe and Nb.

2. The piezoelectric ceramic according to claim 1, wherein β and γ satisfy the following formulae: 0.405≦β≦0.495 and 0.1≦γ≦0.3.

3. The piezoelectric ceramic according to claim 2, wherein said $M2M3O_3$ represents at least one selected from $BiFeO_3$, $NaNbO_3$, $KNbO_3$ and $LiNbO_3$.

4. The piezoelectric element comprising the piezoelectric ceramic according to any one of claims 1 to 3, and electrodes formed on both sides of the piezoelectric ceramic, respectively.

* * * * *